(12) United States Patent
Shao et al.

(10) Patent No.: US 12,317,473 B2
(45) Date of Patent: May 27, 2025

(54) SEMICONDUCTOR DEVICE HAVING PLURALITY OF TRENCHES WITH DIFFERENT DEPTH

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Guangsu Shao, Hefei (CN); Deyuan Xiao, Hefei (CN); Yunsong Qiu, Hefei (CN); Yuhan Zhu, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 363 days.

(21) Appl. No.: 17/951,077

(22) Filed: Sep. 22, 2022

(65) Prior Publication Data
US 2023/0013070 A1 Jan. 19, 2023

Related U.S. Application Data

(63) Continuation of application No. PCT/CN2022/078210, filed on Feb. 28, 2022.

(30) Foreign Application Priority Data

Nov. 15, 2021 (CN) .......................... 202111345286.3

(51) Int. Cl.
*H10B 12/00* (2023.01)
(52) U.S. Cl.
CPC ........... *H10B 12/053* (2023.02); *H10B 12/34* (2023.02); *H10B 12/482* (2023.02); *H10B 12/488* (2023.02)

(58) Field of Classification Search
CPC .... H10B 12/053; H10B 12/34; H10B 12/482; H10B 12/485; H10B 12/488
(Continued)

(56) References Cited

U.S. PATENT DOCUMENTS

2011/0223731 A1* 9/2011 Chung ................ H10D 30/63
438/270

FOREIGN PATENT DOCUMENTS

CN 103531479 A 1/2014
CN 103681599 A 3/2014

* cited by examiner

*Primary Examiner* — Hoai V Pham
(74) *Attorney, Agent, or Firm* — Kilpatrick Townsend & Stockton LLP

(57) ABSTRACT

A semiconductor device and a formation method thereof are provided. The semiconductor device includes: a semiconductor substrate, where a plurality of columnar active areas are formed on the semiconductor substrate, the plurality of columnar active areas are spaced apart by a plurality of first trenches extending along a first direction and a plurality of second trenches extending along a second direction; a plurality of third trenches positioned in the semiconductor substrate at bottoms of the second trenches, where the third trenches are recessed to bottoms of the columnar active areas, and a bottom surface of a given one of the third trenches is higher than a bottom surface of the given first trench; and a plurality of metal silicide bit lines extending along the first direction in the semiconductor substrate positioned at the bottoms of the plurality of third trenches and the bottoms of the plurality of columnar active areas.

5 Claims, 10 Drawing Sheets

(58) Field of Classification Search
USPC .................................. 257/906, 907, 908
See application file for complete search history.

SEMICONDUCTOR DEVICE HAVING PLURALITY OF TRENCHES WITH DIFFERENT DEPTH

CROSS-REFERENCE TO RELATED APPLICATION

This application is a continuation of PCT/CN2022/078210, filed on Feb. 28, 2022, which claims priority to Chinese Patent Application No. 202111345286.3, titled "SEMICONDUCTOR DEVICE AND FORMATION METHOD THEREOF" and filed on Nov. 15, 2021, the entire contents of which are incorporated herein by reference.

TECHNICAL FIELD

The present disclosure relates to the field of memory, and more particularly, to a semiconductor device and a formation method thereof.

BACKGROUND

As a semiconductor memory device commonly used in computers, Dynamic Random Access Memory (DRAM) comprises a number of repeated memory cells. Each memory cell typically includes a capacitor and a transistor, where a gate of the transistor is connected to a word line, and a source and a drain of the transistor are respectively connected to a bit line and the capacitor. A voltage signal of the word line can control on or off of the transistor, such that data information stored in the capacitor may be read by means of the bit line, or the data information is written, by means of the bit line, into the capacitor for storage.

To improve an integration level of a memory structure, a semiconductor device structure using a vertical channel transistor and a formation method thereof are now provided.

SUMMARY

In view of this, some embodiments of the present disclosure provide a method for forming a semiconductor device, including:
  providing a semiconductor substrate, a plurality of columnar active areas being formed on the semiconductor substrate, the plurality of columnar active areas being spaced apart by a plurality of first trenches extending along a first direction and a plurality of second trenches extending along a second direction, the plurality of first trenches communicating with the plurality of second trenches, and a depth of a given one of the plurality of first trenches being greater than a depth of a given one of the plurality of second trenches;
  filling first isolation layers in the given first trench, a top surface of a given one of the first isolation layers being not higher than a bottom surface of the given second trench;
  etching the semiconductor substrate positioned between bottoms of the plurality of second trenches and between the first isolation layers, to form, in the semiconductor substrate at the bottoms of the plurality of second trenches, a plurality of third trenches recessed to bottoms of the plurality of columnar active areas, wherein a bottom surface of a given one of the plurality of third trenches is higher than a bottom surface of the given first trench; and forming a plurality of metal silicide bit lines extending along the first direction in the semiconductor substrate at the bottoms of the plurality of third trenches and the bottoms of the plurality of columnar active areas.

In some embodiments, the method further includes: forming a protective layer on a side wall surface of the given first trench and a side wall surface of the given second trench and on a top surface of a given one of the plurality of columnar active areas.

In some embodiments, the protective layer is formed by means of an atomic layer deposition process, where a material of the protective layer is silicon oxide, silicon nitride, silicon oxynitride, silicon oxycarbide, or silicon carbonitride.

In some embodiments, the given third trench is formed after formation of the given first isolation layer and the protective layer.

In some embodiments, the given third trench is formed by means of an isotropic wet etching process.

In some embodiments, a material of a given one of the plurality of metal silicide bit lines is one or a combination of nickel silicide, tungsten silicide, cobalt silicide, tantalum silicide, and titanium silicide.

In some embodiments, the forming a plurality of metal silicide bit lines includes: forming a metal layer on a surface of the protective layer and a surface of the given first isolation layer and on a side wall and a bottom surface of the given third trench; and annealing the metal layer, such that a metal element in the metal layer diffuses into the semiconductor substrate exposed by the given third trench and reacts with silicon to form a metal silicide.

In some embodiments, all silicon in the semiconductor substrate positioned below the given columnar active area and between adjacent two of the plurality of third trenches reacts with the metal layer to form the given metal silicide bit line.

In some embodiments, the method further includes: performing round corner processing on side walls of the plurality of columnar active areas to form the plurality of columnar active areas in cylindrical shape.

In some embodiments, the round corner processing includes: oxidizing the side walls of the plurality of columnar active areas to form a silicon oxide layer; and removing the silicon oxide layer by means of a wet etching process.

In some embodiments, the method further includes: removing the protective layer and the first isolation layer; and forming a second isolation layer on a surface of a given one of the plurality of metal silicide bit lines and in the given first trench and the given second trench.

In some embodiments, the method further includes: forming a plurality of discrete word line gate structures extending along the second direction on side walls of the plurality of columnar active areas; forming a capacitor at a top of the given columnar active area; and adjacent two of the plurality of word line gate structures, adjacent two of the plurality of metal silicide bit lines, a given one of the plurality of word line gate structures and the capacitor, and the given word line gate structure and the semiconductor substrate being isolated by the second isolation layer.

Some embodiments of the present disclosure also provide a semiconductor device, including:
  a semiconductor substrate, a plurality of columnar active areas being formed on the semiconductor substrate, the plurality of columnar active areas being spaced apart by a plurality of first trenches extending along a first direction and a plurality of second trenches extending along a second direction, the plurality of first trenches communicating with the plurality of second trenches, and a depth of a given one of the plurality of first trenches being greater than a depth of a given one of the plurality of second trenches;

a plurality of third trenches positioned in the semiconductor substrate at bottoms of the plurality of second trenches, the plurality of third trenches being recessed to bottoms of the plurality of columnar active areas, a bottom surface of a given one of the plurality of third trenches being higher than a bottom surface of the given first trench; and a plurality of metal silicide bit lines extending along the first direction in the semiconductor substrate positioned at the bottoms of the plurality of third trenches and the bottoms of the plurality of columnar active areas.

In some embodiments, a material of a given one of the plurality of metal silicide bit lines is one or a combination of nickel silicide, tungsten silicide, cobalt silicide, tantalum silicide, and titanium silicide.

In some embodiments, the plurality of columnar active areas are columnar active areas in cylindrical shape.

In some embodiments, the semiconductor device further includes: a second isolation layer positioned on a surface of a given one of the plurality of metal silicide bit lines and in the given first trench and the given second trench.

In some embodiments, the semiconductor device further includes a plurality of discrete word line gate structures positioned on side walls of the plurality of columnar active areas and extending along the second direction; and a capacitor positioned at a top of the given columnar active area. Adjacent two of the plurality of word line gate structures, adjacent two of the plurality of metal silicide bit lines, a given one of the plurality of word line gate structures and the capacitor, and the given word line gate structure and the semiconductor substrate are isolated by the second isolation layer.

In the method for forming a semiconductor device in some of the foregoing embodiments of the present disclosure, a plurality of columnar active areas are formed on a semiconductor substrate, the plurality of columnar active areas are spaced apart by a plurality of first trenches extending along a first direction and a plurality of second trenches extending along a second direction, where the plurality of first trenches communicate with the plurality of second trenches. After a depth of a given one of the plurality of first trenches is greater than a depth of a given one of the plurality of second trenches, first isolation layers are filled in the given first trench, where a surface of a given one of the first isolation layers is lower than a top surface of a given one of the plurality of columnar active areas; etching the semiconductor substrate positioned between a bottom of the given second trench and the given first isolation layer, to form, in the semiconductor substrate at the bottoms of the plurality of second trenches, a plurality of third trenches recessed to bottoms of the plurality of columnar active areas, where a bottom surface of a given one of the plurality of third trenches is higher than a bottom surface of the given first trench; and forming a plurality of metal silicide bit lines extending along the first direction in the semiconductor substrate at the bottoms of the plurality of third trenches and the bottoms of the plurality of columnar active areas. The semiconductor device formed in the present disclosure is improved in integration level, and a metal silicide bit line formed in the present disclosure is defined in a plurality of third trenches and at a bottom of a columnar active area between the plurality of third trenches, such that positional accuracy of a metal silicide formed is improved, and a problem of occurrence of an open circuit and a short circuit between adjacent metal silicide bit lines is reduced, and thus electrical performance of a bit line is improved.

DETAILED DESCRIPTION

As mentioned in the background art, an integration level of an existing memory structure still needs to be improved.

Therefore, the present disclosure provides a semiconductor device and a formation method thereof, which improves the integration level of a device and improves electrical performance of a bit line.

To make the foregoing objectives, features, and advantages of the present disclosure more apparent and lucid, embodiments of the present disclosure are described in detail below with reference to the accompanying drawings. When the embodiments of the present disclosure are described in detail, for ease of description, schematic diagrams are not partially enlarged according to a general scale, and the schematic diagrams are only examples, which should not limit the scope of protection of the present disclosure here. In addition, three-dimensional spatial dimensions of a length, a width and a depth should be included in actual fabrication.

Figure 1:
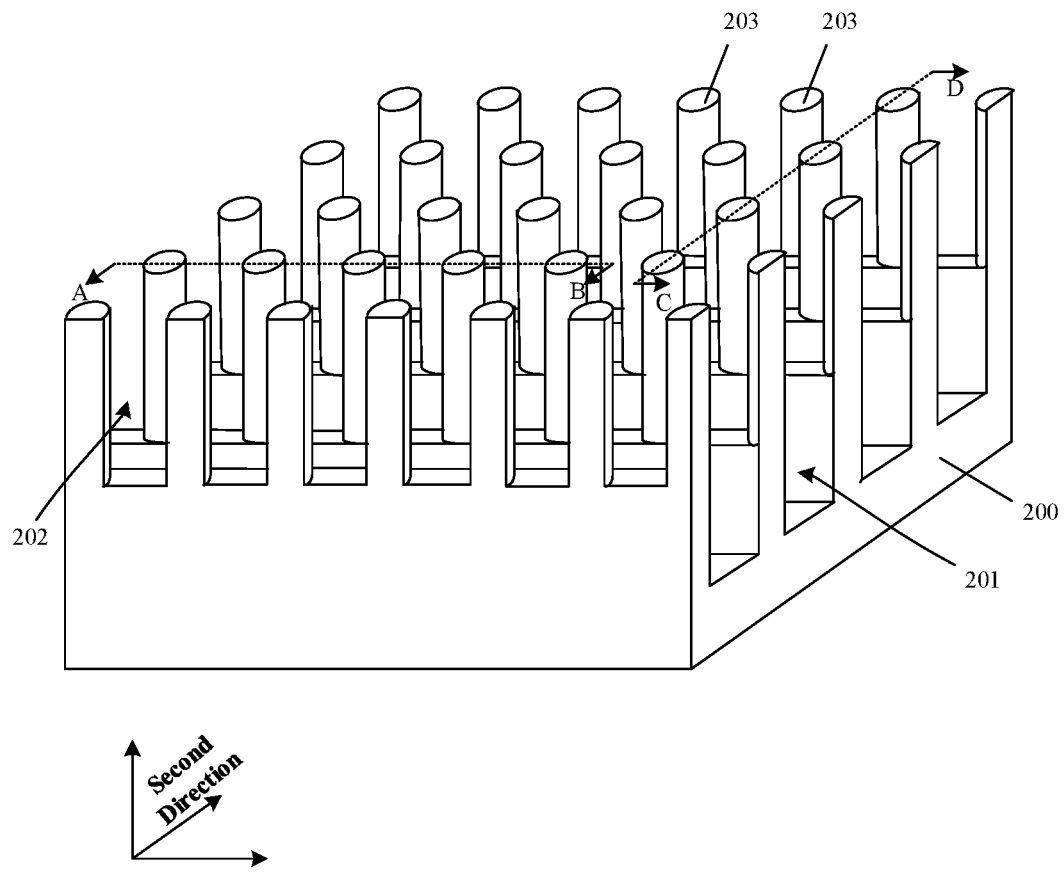
FIGS. 1 to 23 are schematic structural diagrams of a process for forming a semiconductor device in some embodiments of the present disclosure.
Figure 2:
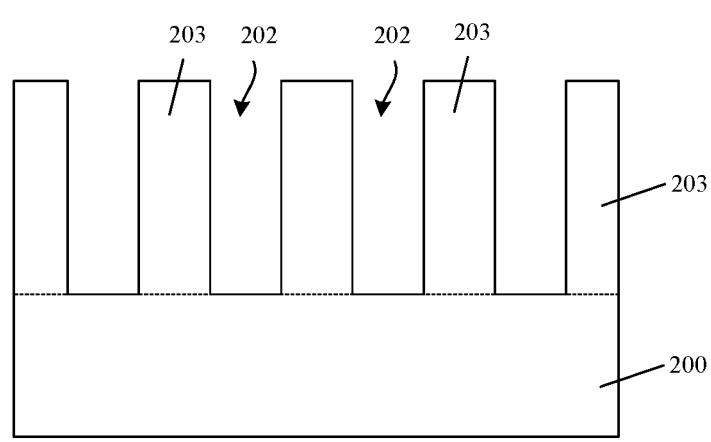
Figure 3:
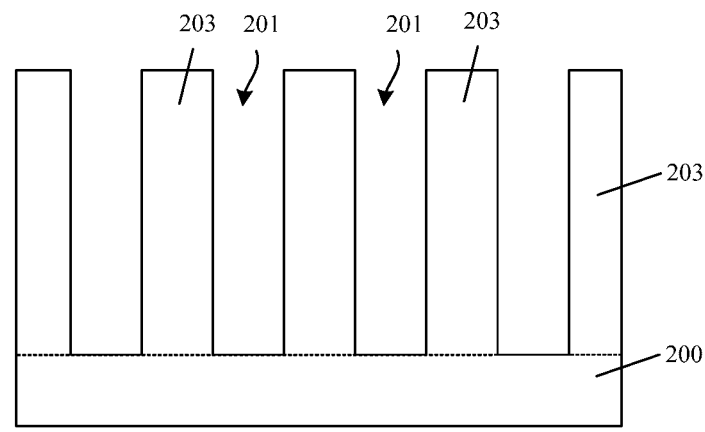

Referring to FIGS. 1 to 3, FIG. 2 is a schematic cross-sectional structural diagram of FIG. 1 along a direction AB of a cutting line, and FIG. 3 is a schematic cross-sectional structural diagram of FIG. 1 along a direction CD of the cutting line. A semiconductor substrate 200 is provided, a plurality of columnar active areas 203 are formed on the semiconductor substrate 200, the plurality of columnar active areas 203 are spaced apart by a plurality of first trenches 201 extending along a first direction and a plurality of second trenches 202 extending along a second direction, where the first trenches 201 communicate with the second trenches 202, and a depth of one of the first trenches 201 is greater than a depth of one of the second trenches 202.

A material of the semiconductor substrate 200 may be silicon (Si), germanium (Ge), silicon germanium (GeSi), silicon carbide (SiC), silicon-on-insulator (SOI), germanium-on-insulator (GOI), or other materials, e.g., III-V group compounds such as gallium arsenide. In this embodiment, the material of the semiconductor substrate 200 is silicon. The semiconductor substrate 200 needs to be doped with certain impurity ions according to a type of a vertical transistor formed subsequently. For example, well doping and drain doping may be carried out for the semiconductor substrate. The impurity ions for the well doping may be N-type impurity ions or P-type impurity ions, where the P-type impurity ions are one or more of boron ions, gallium ions or indium ions, and the N-type impurity ions are one or more of phosphorus ions, arsenic ions or antimony ions. Types of the impurity ions for the drain doping are different from those of the impurity ions for the well doping, the drain doping is configured for forming a drain region of the vertical transistor, and the impurity ions for the drain doping may be N-type impurity ions or P-type impurity ions.

In this embodiment, the columnar active area 203 is formed by etching the semiconductor substrate 200. In some other embodiments, the columnar active area 203 may be formed by means of an epitaxial process.

The columnar active area 203 is subsequently configured to form a channel region, a source region and the drain region of the vertical transistor. A plurality of columnar active areas 203 are discrete. Adjacent columnar active areas 203 are spaced apart by a plurality of first trenches 201 extending along a first direction and a plurality of second trenches 202 extending along a second direction. In this embodiment, the plurality of columnar active areas 203 are arranged in rows and columns. In other embodiments, the plurality of columnar active areas may also be arranged in other manners.

In some embodiments, the first direction and the second direction are perpendicular to each other, and an angle between the first direction and the second direction is 90°. In other embodiments, the first direction and the second direction may not be perpendicular to each other. For example, the angle between the first direction and the second direction may be an acute angle.

In some embodiments, the plurality of first trenches 201 extend along the first direction, the plurality of second trenches 202 extend along the second direction, the first trenches 201 and the second trenches 202 communicate with each other at intersections, and a depth of each of the first trenches 201 is greater than a depth of each of the second trenches 202. When the depth of the first trench 201 is greater than that of the second trench 202, a first isolation layer is formed at a bottom of the first trench 201 subsequently, which facilitates defining a position of a third trench formed subsequently and improving a positional accuracy, thereby improving the positional accuracy of a metal silicide bit line formed in the semiconductor substrate in the third trench and at a bottom of the columnar active area between the third trenches.

In some embodiments, the semiconductor substrate 200 may be etched first to form the plurality of first trenches 201 extending along the first direction and spaced apart, and then the semiconductor substrate 200 is etched to form the plurality of second trenches 202 extending along the second direction, where the depth of the second trench 202 formed is smaller than that of the first trench. In another embodiment, the semiconductor substrate 200 may be etched first to form the plurality of second trenches 202 extending along the second direction, and then the semiconductor substrate 200 is etched to form the plurality of first trenches 201 extending along the first direction and spaced apart, where the depth of the first trench formed 201 is greater than that of the second trench 202. In another embodiment, the semiconductor substrate 200 may be etched first to simultaneously form first initial trenches and the second trenches in the semiconductor substrate 200, and then the first initial trenches continue to be etched to form the first trenches 201, where the depth of the first trench 201 is greater than that of the second trench 202. In some embodiments, before the semiconductor substrate 200 is etched, a corresponding mask layer is formed on the semiconductor substrate 200, and the semiconductor substrate 200 is etched using the mask layer as a mask to form the first trenches and/or the second trenches in the semiconductor substrate 200.

In this embodiment, the columnar active areas 203 are columnar active areas in cylindrical shape, where the cylindrical shape includes an elliptical cylindrical shape, such that the integration level of the device is improved. The forming a plurality of columnar active areas 203 in cylindrical shape includes: forming a plurality of rectangular columnar active areas on the semiconductor substrate 200; and performing round corner processing on side walls of the columnar active areas to form the columnar active areas in cylindrical shape. In some embodiments, the round corner processing includes: oxidizing the side walls of the rectangular columnar active areas to form a silicon oxide layer; and removing the silicon oxide layer by means of a wet etching process. In other embodiments, after the formation of the rectangular columnar active areas, the round corner processing is skipped, and subsequent processes are directly performed.

Figure 4:
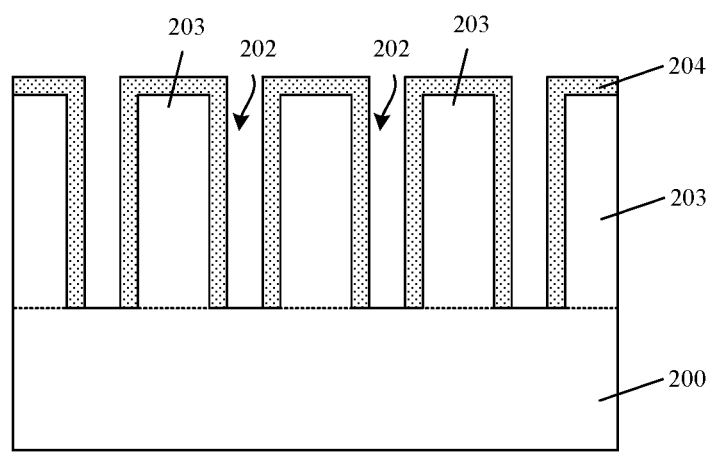
Figure 5:
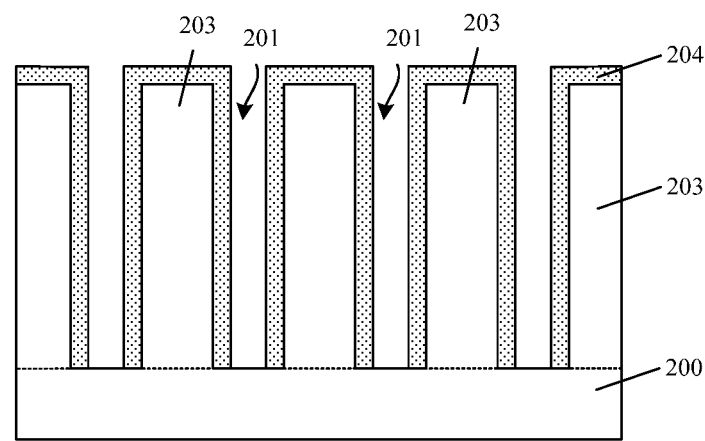

Referring to FIG. 4 and FIG. 5, FIG. 4 is on the basis of FIG. 2, and FIG. 5 is on the basis of FIG. 3, a protective layer 204 is formed on a side wall surface of the first trench 201 and a side wall surface of the second trench 202 and on a top surface of the columnar active area 203.

In one aspect, the protective layer 204 defines an opening position of the third trench during subsequent formation of the third trench. In another aspect, the protective layer 204 prevents a metal layer from reacting with a silicon material on a side wall of the first trench and a side wall of the second trench during subsequent formation of the metal silicide bit line.

In an embodiment, the forming the protective layer 204 includes: forming the protective layer on the side wall surface and a bottom surface of the first trench 201 and the side wall surface and a bottom surface of the second trench 202 and on the top surface of the columnar active area 203; and removing the protective layer on the bottom surface of the first trench 201 and the bottom surface of the second trench 202, to expose the protective layer 204 on the side wall surface of the first trench 201 and the side wall surface of the second trench 202 and on the top surface of the columnar active area 203.

In some embodiments, a material of the protective layer 204 is silicon oxide, silicon nitride, silicon oxynitride, silicon oxycarbide, or silicon carbonitride. In this embodiment, the material of the protective layer 204 is silicon oxide.

The protective layer 204 is formed by means of a deposition process. In some embodiments, the protective layer 204 is formed by means of an atomic layer deposition process. The protective layer 204 formed by means of the atomic layer deposition process has relatively high density, and may well prevent metal in the metal layer from diffusing to the side wall of the first trench and the side wall of the second trench during subsequent formation of the metal silicide bit line.

Figure 6:
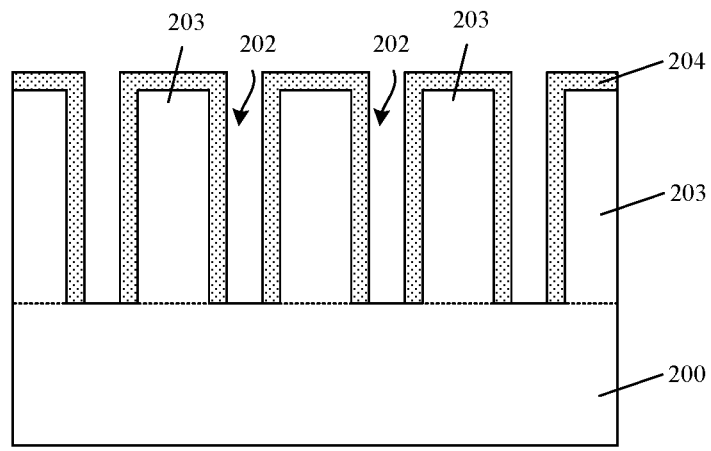
Figure 7:
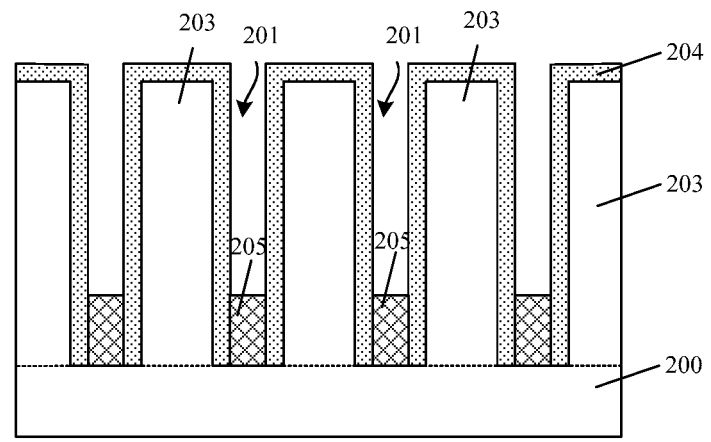

Referring to FIG. 6 and FIG. 7, a first isolation layer 205 is filled in the first trench 201, and a top surface of the first isolation layer 205 is not higher than a bottom surface of the second trench 202.

The first isolation layer 205 is formed to prevent a metal silicide from being formed at a bottom of the second trench during subsequent formation of the metal silicide bit line.

A material of the first isolation layer 205 is different from the material of the protective layer 204. In some embodiments, the material of the first isolation layer 205 may be silicon oxide, silicon nitride, silicon oxynitride, silicon oxycarbide, silicon carbonitride, photoresist material or porous material. In this embodiment, the material of the first isolation layer 205 is silicon nitride, where the silicon nitride is low-density silicon nitride, to reduce stress of the first isolation layer 205 to the columnar active area.

In some embodiments, a top surface of the first isolation layer 205 formed is lower than the bottom surface of the given second trench 202. In other embodiments, the top surface of the formed first isolation layer 205 is flush with the bottom surface of the given second trench 202.

In some embodiments, forming the first isolation layer 205 includes: forming a first isolation material layer on a surface of the protective layer 204 and in the first trench 201 and the second trench 202; and etching back to remove the first isolation material layer of a partial thickness, to expose the semiconductor substrate 200 at the bottom of the second trench 202, and form the first isolation layer 205 in the first trench 201, where a surface of the first isolation layer 205 is lower than the top surface of the columnar active area 203.

Figure 8:
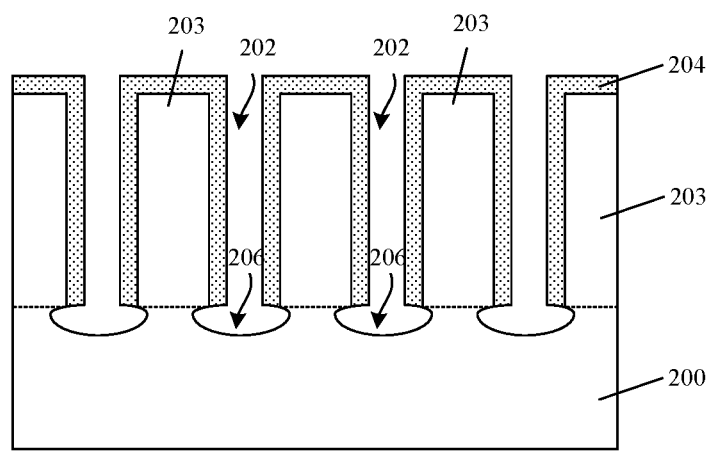
Figure 9:
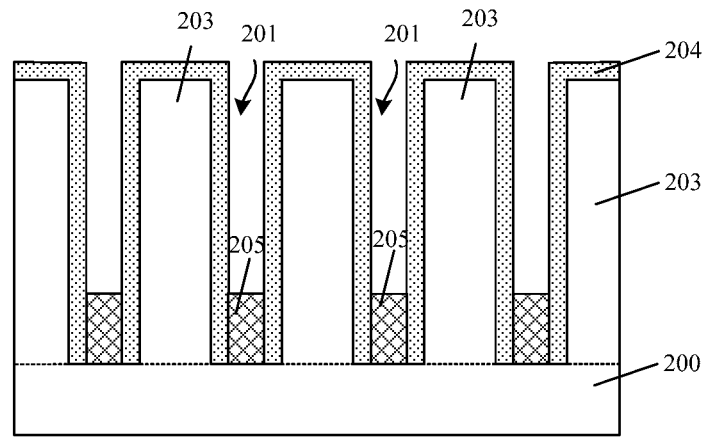

Referring to FIG. 8 and FIG. 9, the semiconductor substrate 200 positioned between bottoms of the second trenches 202 and between the first isolation layers 205 is etched, and a plurality of third trenches 206 recessed to bottoms of the columnar active areas 203 are formed in the semiconductor substrate 200 at the bottoms of the second trenches 202, where a bottom surface of a the third trench 206 is higher than that of the first trench 201.

The third trench 206 is formed after formation of the first isolation layer 205 and the protective layer 204.

In some embodiments, the third trench 206 is formed by means of an isotropic wet etching process. The third trenches 206 formed are recessed to the bottoms of the columnar active areas 203, such that during subsequent formation of the metal silicide bit lines, the connected metal silicide bit lines can be easily formed at the bottoms of a certain row of the columnar active areas in the first direction and in the plurality of third trenches.

In some embodiments, a wet etching solution used in the isotropic wet etching process is a tetramethylammonium hydroxide (TMAH) solution or potassium hydroxide solution, and the third trench 206 formed is in a "σ" shape, such that the third trench 206 formed has a tip end protruding toward the bottom of the columnar active area 203. During subsequent formation of the metal silicide bit lines, the metal in the metal layer is more easily to react with the silicon at the bottoms of the columnar active areas 203 to form the connected metal silicide bit lines at the bottoms of a certain row of the columnar active areas in the first direction and in the plurality of third trenches.

In some embodiments, during etching the semiconductor substrate 200 between the bottom of the second trench 202 and the first isolation layer 205, the etching solution may rapidly etch the side wall of the columnar active area 203 close to the first isolation layer 205, such that the plurality of third trenches 206 formed may be communicated on outer side walls of the columnar active areas 203, and the connected metal silicide bit lines can be more easily formed at the bottoms of a certain row of columnar active areas in the first direction and in the plurality of third trenches.

Figure 10:
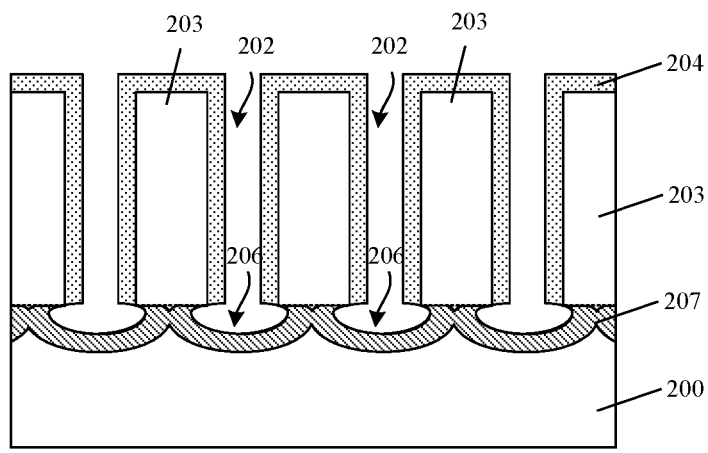
Figure 11:
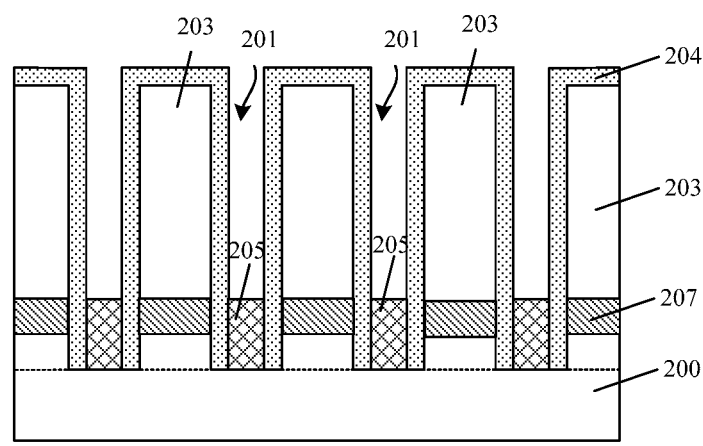

Referring to FIG. 10 and FIG. 11, a plurality of metal silicide bit lines 207 extending along the first direction are formed in the semiconductor substrate 200 at the bottom of the third trench 206 and the bottom of the columnar active area 203.

The plurality of metal silicide bit lines 207 formed are discrete. In some embodiments, the plurality of metal silicide bit lines 207 are parallel to one another. Each of the plurality of metal silicide bit lines 207 is positioned at the bottoms of a certain row of columnar active areas in the first direction and in the plurality of third trenches, such that the drain regions formed at the bottoms of this row of columnar active areas are connected together. That is, the metal silicide bit lines 207 formed in the present disclosure are defined in the plurality of third trenches 206 and at the bottoms of the columnar active areas 203 between the third trenches 206. Therefore, the positional accuracy of the metal silicide bit lines 207 formed is improved, and a problem of occurrence of an open circuit and a short circuit between adjacent metal silicide bit lines is reduced, and thus electrical performance of the bit line is improved.

In some embodiments, a material of the metal silicide bit line 207 is one or a combination of nickel silicide, tungsten silicide, cobalt silicide, tantalum silicide, and titanium silicide.

In some embodiments, the forming a plurality of metal silicide bit lines 207 includes: forming a metal layer (not shown in the figure) on the surface of the protective layer 204 and the surface of the first isolation layer 205 and on a side wall and a bottom surface of the third trench 206; annealing the metal layer, such that a metal element in the metal layer diffuses into the semiconductor substrate 200 exposed by the third trench 206 and reacts with silicon to form the metal silicide, where the metal layer in other position does not react with the silicon due to isolation of the protective layer and the first isolation layer between the metal layer and the semiconductor substrate; and removing the metal layer unreacted. In this way, the plurality of discrete metal silicide bit lines 207 extending along the first direction are formed in the plurality of third trenches 206 and in the semiconductor substrate 200 at the bottoms of the plurality of corresponding columnar active areas 203 (referring to FIGS. 12 to 14). Because the metal in the metal layer only reacts with the semiconductor substrate 200 exposed by the third trenches 206, the metal silicide bit lines 207 formed are defined in the plurality of third trenches 206 and at the bottoms of the columnar active areas 203 between the third trenches 206, such that the positional accuracy of the metal silicide bit lines 207 formed is improved, and occurrence of the short circuit in the metal silicide bit lines 207 can be prevented. Moreover, because the metal silicide bit lines 207 formed have the protective layer and the first isolation layer therein for isolation, no short circuit occurs between adjacent metal silicide bit lines 207. In addition, the metal silicide bit lines 207 formed do not take up space of the first trenches, such that a spacing between adjacent metal silicide bit lines 207 is larger, which can prevent occurrence of a problem of electric leakage between adjacent metal silicide bit lines 207.

In some embodiments, all the silicon in the semiconductor substrate 200 positioned below the columnar active areas 203 and between adjacent third trenches 206 reacts with the metal layer to form the metal silicide bit lines 207.

Figure 12:
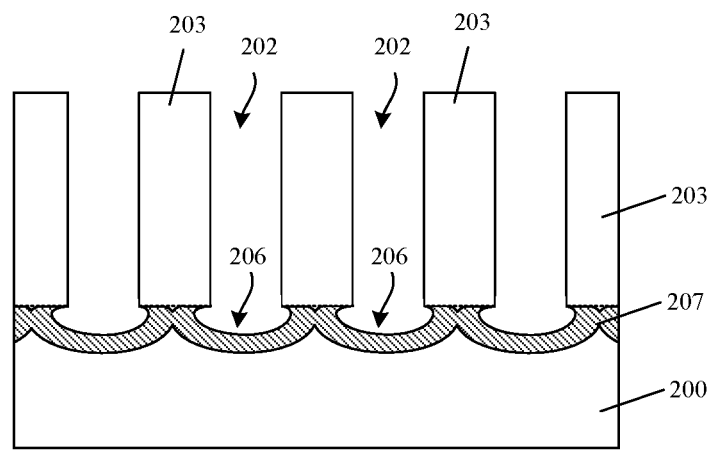
Figure 13:
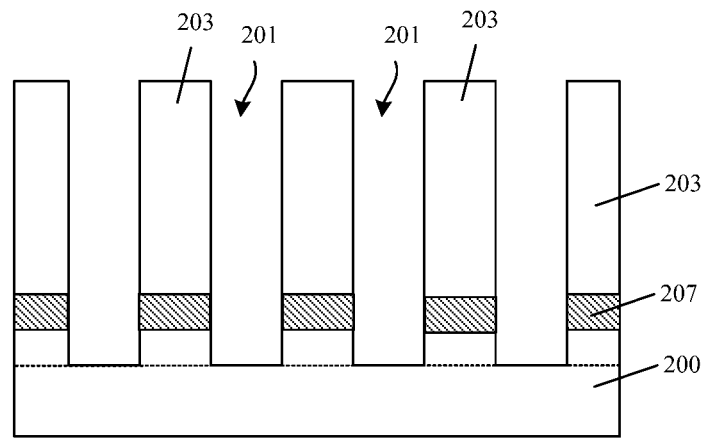
Figure 14:
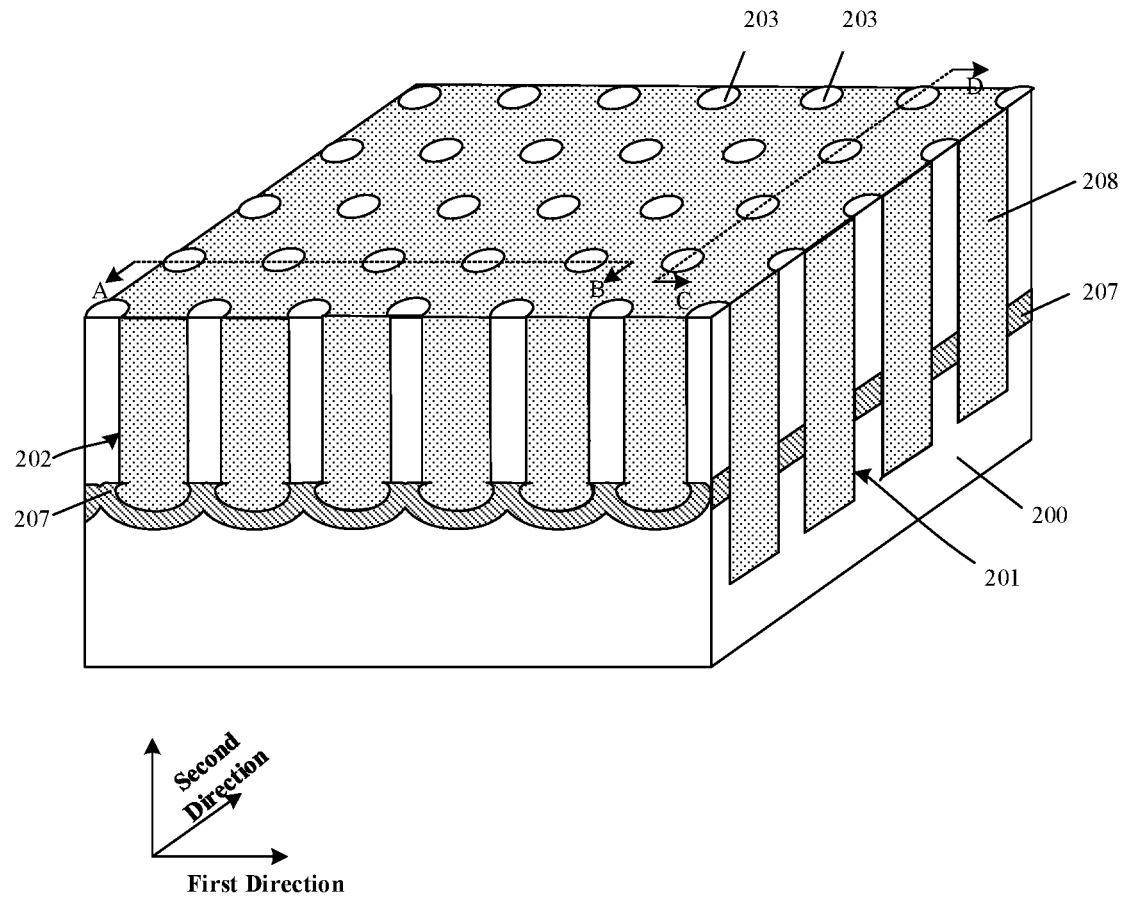
Figure 15:
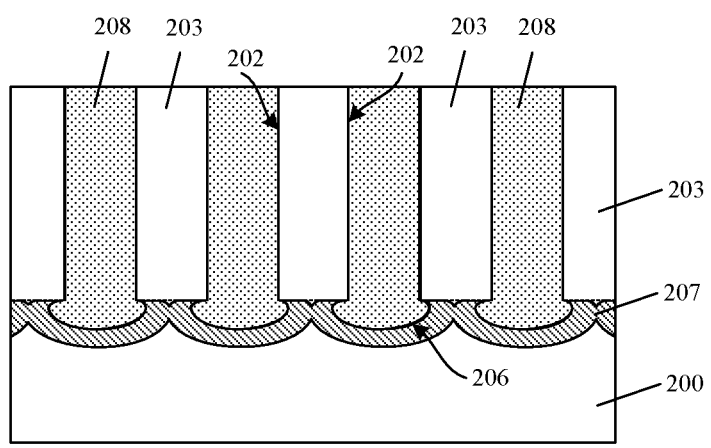
Figure 16:
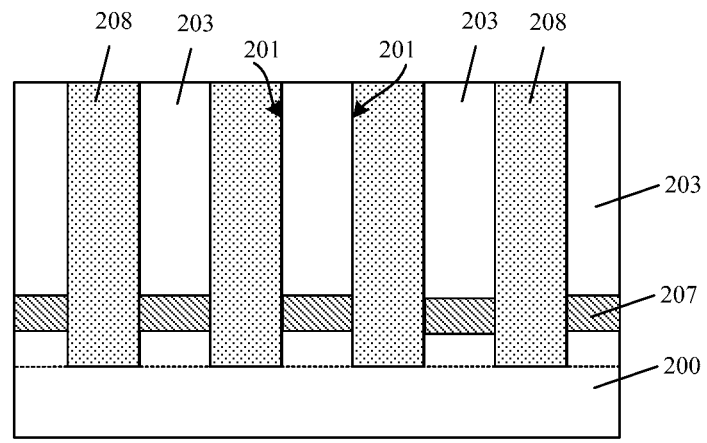

In some embodiments, referring to FIG. 12 and FIG. 13, after forming the metal silicide bit lines 207, the method further includes: removing the protective layer 204 and the first isolation layer 205 (referring to FIGS. 10 to 11). In some embodiments, the protective layer and the first isolation layer may be removed by means of the isotropic wet etching process. Referring to FIGS. 14 to 16, FIG. 15 is a schematic cross-sectional structural diagram of FIG. 14 along a direction AB of a cutting line, and FIG. 16 is a schematic cross-sectional structural diagram of FIG. 14 along a direction CD of the cutting line, initial second isolation layers 208 are formed on a surface of the metal silicide bit line 207 and in the first trench 201 and the second trench 202.

In some embodiments, the initial second isolation layer 208 may be a single-layer structure formed by one of silicon oxide, silicon nitride, silicon oxynitride, FSG (fluorine-doped silicon dioxide), BSG (boron-doped silicon dioxide), PSG (phosphorus-doped silicon dioxide) or BPSG (boron-phosphorus-doped silicon dioxide), and a low dielectric constant material, or a stack structure formed by two or more materials in groups comprising the above materials.

Figure 17:
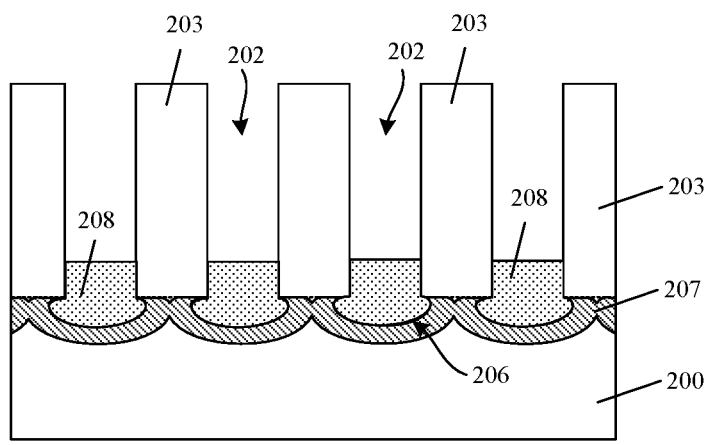
Figure 18:
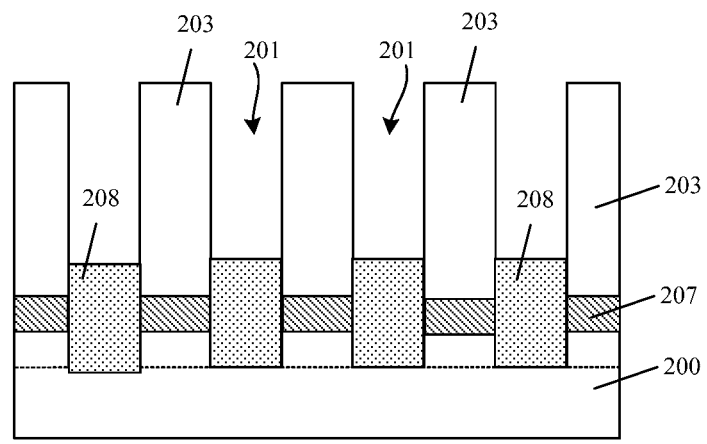

In some other embodiments, referring to FIG. 17 and FIG. 18, the method further includes: etching back to remove the second isolation layer 208 of a partial thickness, such that a surface of a remaining portion of the initial second isolation layer 208 is lower than the top surface of the columnar active area 203.

Figure 19:
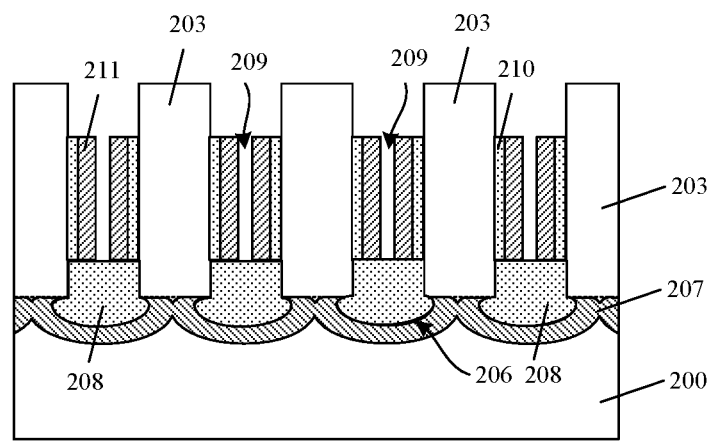
Figure 20:
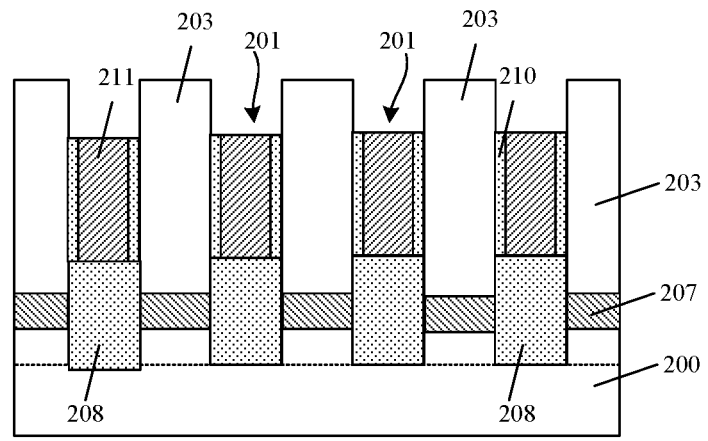
Figure 21:
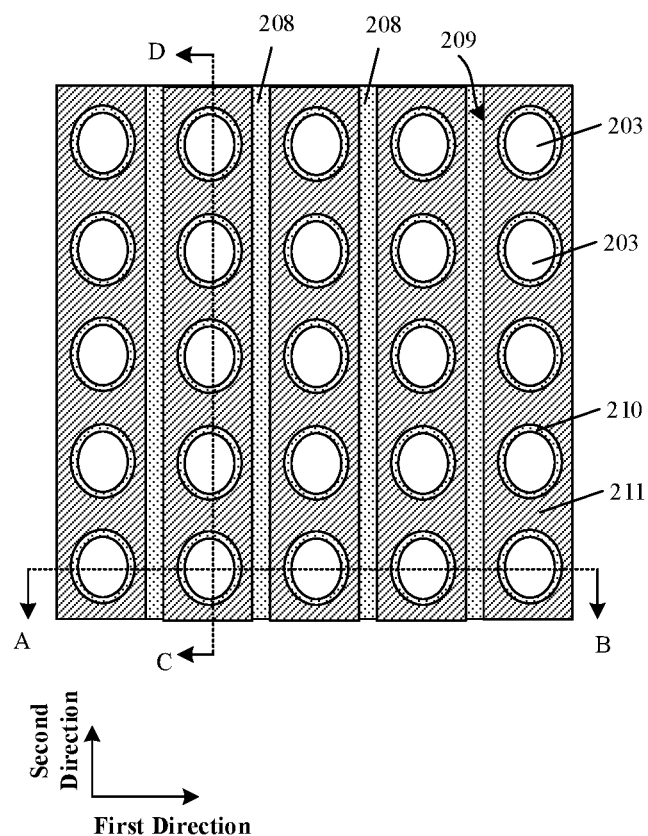

Referring to FIGS. 19 to 21, FIG. 19 is on the basis of FIG. 17, FIG. 20 is on the basis of FIG. 18, FIG. 21 is a top view, FIG. 19 is a schematic cross-sectional structural diagram of FIG. 21 along the direction AB of the cutting line, and FIG. 20 is a schematic cross-sectional structural diagram of FIG. 21 along the direction CD of the cutting line. A plurality of discrete word line gate structures (211 and 210) extending along the second direction are formed on the remaining portion of the initial second isolation layer 208 and on the side wall of the columnar active area 203.

In one embodiment, each of the word line gate structures (211 and 210) includes a gate oxide layer 210 wrapping the side wall of the columnar active area 203 and a metal gate 211 formed on a side wall surface of the gate oxide layer 210 to surround the columnar active area 203. Forming the word line gate structures (211 and 210) includes: forming the gate oxide layers 210 wrapping the side wall of the columnar active area 203; forming metal gate material layers surrounding the side walls of the columnar active areas 203 on a side wall surface of the gate oxide layer 210; and cutting off the metal gate material layers along the second direction to form gaps 209 and a plurality of metal gates 211.

Figure 22:
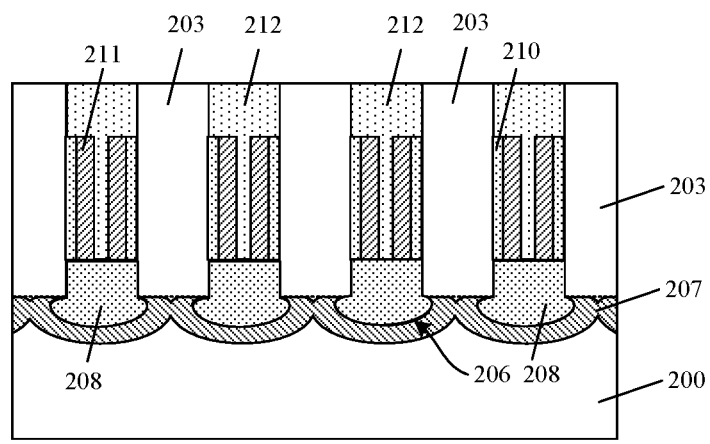
Figure 23:
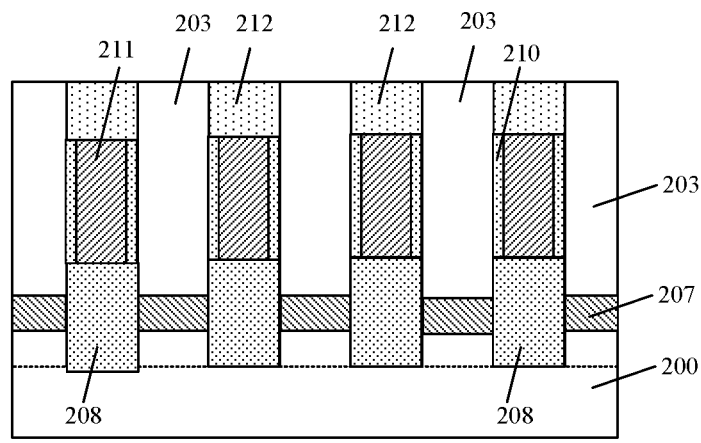

Referring to FIG. 22 and FIG. 23, supplementary second isolation layers 212 are formed on the word line gate structures and in the gaps, where the remaining portion of the initial second isolation layer 208 and the supplementary second isolation layer 212 constitute the second isolation layer. That is, the adjacent word line gate structures, the adjacent metal silicide bit lines 207, the word line gate structure and the capacitor formed subsequently, and the word line gate structure and the semiconductor substrate are isolated by the second isolation layer.

The method further includes: doping the impurity ions into the top surface of the columnar active area, to form the source region on the top surface of the columnar active area; and forming the capacitor connected to the source region on the top of the columnar active area.

Some embodiments of the present disclosure also provide a semiconductor device. Referring to FIGS. 14-16, the semiconductor device includes:

a semiconductor substrate 200, where the semiconductor substrate 200 has a plurality of columnar active areas 203, the plurality of columnar active areas 203 are spaced apart by a plurality of first trenches 201 extending along a first direction and a plurality of second trenches 202 extending along a second direction, the plurality of first trenches 201 communicate with the plurality of second trenches 202, and a depth of one of the plurality of first trenches 201 is greater than a depth of one of the plurality of second trenches 202;

a plurality of third trenches 206 (referring to FIG. 15) in the semiconductor substrate 200 positioned at the bottom of the second trench 202, where the third trenches 206 are recessed toward the bottom of the columnar active area 203, and a bottom surface of the third trench 206 is higher than that of the first trench 201; and a plurality of metal silicide bit lines 207 extending along the first direction in the semiconductor substrate 200 positioned at the bottoms of the plurality of third trenches 206 and the bottoms of the plurality of columnar active areas 203.

In some embodiments, a material of the metal silicide bit line 207 is one or a combination of nickel silicide, tungsten silicide, cobalt silicide, tantalum silicide, and titanium silicide.

In some embodiments, the columnar active areas 203 are columnar active areas in cylindrical shape.

In some embodiments, referring to FIG. 22 and FIG. 23, the semiconductor device further includes: second isolation layers (208 and 212) positioned on a surface of the metal silicide bit line 207 and in the first trench and the second trench.

In some embodiments, referring to FIG. 22 and FIG. 23, the semiconductor device further includes: a plurality of discrete word line gate structures positioned on side walls of the columnar active areas 203 and extending along the second direction; a source region at the top surface of the columnar active area; and a capacitor positioned at a top of the columnar active area and connected to the source region.

It is to be noted that definitions or descriptions of structures in this embodiment (semiconductor device) the same as or similar to those in the previous embodiments (processes of forming the semiconductor device) will not be repeated in this embodiment, and reference may be made to the definitions or descriptions of corresponding parts in the foregoing embodiments.

While the present disclosure has been disclosed by some embodiments above, these embodiments are not intended to limit the present disclosure. Those skilled in the art should understand that, possible change and modification may be made on the technical solutions of the present disclosure, without departing from the spirit and scope of the present disclosure, by using the methods and technical contents disclosed above. Therefore, any simple modifications, equivalent changes and embellishments of the above embodiments, which are not departing from the content of the technical solutions of the present disclosure, according to the technical essence of the present disclosure, are all within the scope of protection of the technical solutions of the present disclosure.

What is claimed is:

1. A semiconductor device, comprising:
    a semiconductor substrate, a plurality of columnar active areas being formed on the semiconductor substrate, the plurality of columnar active areas being spaced apart by a plurality of first trenches extending along a first direction and a plurality of second trenches extending along a second direction, the plurality of first trenches communicating with the plurality of second trenches, and a depth of a given one of the plurality of first trenches being greater than a depth of a given one of the plurality of second trenches;
    a plurality of third trenches positioned in the semiconductor substrate at bottoms of the plurality of second trenches, the plurality of third trenches being recessed to bottoms of the plurality of columnar active areas, a bottom surface of a given one of the plurality of third trenches being higher than a bottom surface of the given first trench; and
    a plurality of metal silicide bit lines extending along the first direction in the semiconductor substrate positioned at the bottoms of the plurality of third trenches and the bottoms of the plurality of columnar active areas.

2. The semiconductor device according to claim 1, wherein a material of a given one of the plurality of metal silicide bit lines is one or a combination of nickel silicide, tungsten silicide, cobalt silicide, tantalum silicide, and titanium silicide.

3. The semiconductor device according to claim 1, wherein the plurality of columnar active areas are columnar active areas in cylindrical shape.

4. The semiconductor device according to claim 1, further comprising a second isolation layer positioned on a surface of a given one of the plurality of metal silicide bit lines and in the given first trench and the given second trench.

5. The semiconductor device according to claim 4, further comprising a plurality of discrete word line gate structures positioned on side walls of the plurality of columnar active areas and extending along the second direction; and a capacitor positioned at a top of the given columnar active area; wherein adjacent two of the plurality of word line gate structures, adjacent two of the plurality of metal silicide bit lines, a given one of the plurality of word line gate structures and the capacitor, and the given word line gate structure and the semiconductor substrate are isolated by the second isolation layer.

* * * * *